US006956456B2

United States Patent
Mihara et al.

(10) Patent No.: US 6,956,456 B2
(45) Date of Patent: Oct. 18, 2005

(54) MAGNETRON DRIVE BOOSTING TRANSFORMER

(75) Inventors: Makoto Mihara, Nara (JP); Kenji Yasui, Yamatokoriyama (JP); Takeshi Kitaizumi, Toyonaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 166 days.

(21) Appl. No.: 10/432,578

(22) PCT Filed: Jan. 15, 2003

(86) PCT No.: PCT/JP03/00279

§ 371 (c)(1),
(2), (4) Date: May 23, 2003

(87) PCT Pub. No.: WO03/077603

PCT Pub. Date: Sep. 18, 2003

(65) Prior Publication Data

US 2004/0239464 A1 Dec. 2, 2004

(30) Foreign Application Priority Data

Mar. 12, 2002 (JP) .......................................... 2002-067067
Mar. 12, 2002 (JP) .......................................... 2002-067068

(51) Int. Cl.$^7$ ............................................... H01F 17/06
(52) U.S. Cl. ........................... 336/178; 336/83; 336/234
(58) Field of Search ........................... 336/83, 180–184, 336/212, 233–234, 178; 219/756–760

(56) References Cited

U.S. PATENT DOCUMENTS 3,209,295 A * 9/1965 Baermann .................... 336/155
2002/0171524 A1 * 11/2002 Tsai ............................. 336/96

FOREIGN PATENT DOCUMENTS

| JP | 58-103110 | * | 6/1983 |
| JP | 02-056910 | * | 2/1990 |
| JP | 04-154626 | * | 5/1992 |
| JP | 10-027720 | * | 1/1998 |

* cited by examiner

*Primary Examiner*—Tuyen T Nguyen
(74) *Attorney, Agent, or Firm*—Pearne & Gordon LLP

(57) ABSTRACT

The present invention provides a boosting transformer for microwave oven, which is low in high-frequency loss, hardly saturated, small in size and easy to produce. The boosting transformer includes a rod-like ferrite core; and primary, secondary and heater windings wound around the rod-like ferrite core and piled up side by side in a direction of an axis of the rod-like ferrite core. It also includes a metal core formed from a long metal thin plate rolled by a plurality of times into a square-ring having one inner diameter larger than each of outer sizes of the primary, secondary and heater windings and the other inner diameter larger than a total size of the three windings piled up side by side, the metal core being arranged opposite to the rod-like ferrite core through a gap so as to be fitted toward the rod-like ferrite core from the outside of the primary, secondary and heater windings.

21 Claims, 11 Drawing Sheets

MAGNETRON DRIVE BOOSTING TRANSFORMER

TECHNICAL FIELD

The present invention relates to high frequency induction heating using a magnetron in a microwave oven or the like and particularly to a boosting transformer for driving a magnetron by a switching power supply.

BACKGROUND ART

FIG. 1 is a configuration diagram of a magnetron drive electric source using a boosting transformer as a subject of the invention. In FIG. 1, an alternating current from a commercial electric source 11 is rectified into a direct current by a rectifier circuit 13. The direct current is smoothed by a choke coil 14 and a filter capacitor 15 on an output side of the rectifier circuit 13 and then given to an input side of an inverter 16. The direct current is converted into a desired high frequency (20 to 40 kHz) by the ON/OFF action of a semiconductor switching device in the inverter 16. The inverter 16 has two groups of switching devices, and a drive circuit for driving the two groups of switching devices. For example, each of the switching device groups is constituted by a plurality of power MOSFETs connected in parallel with one another to perform high-speed switching of the direct current. Drains of the power MOSFETs constituting the switching device groups are connected to opposite ends of a primary winding 181 of the boosting transformer 18. Sources of the power MOSFETs constituting one of the two switching device groups are connected to sources of the power MOSFETs constituting the other switching device group respectively. Gates of the power MOSFETs constituting the switching device groups are connected to the switching device drive circuit. The switching device groups constituted by the power MOSFETs are driven by an inverter control circuit 161 so that a current flowing in the primary side of the boosting transformer 18 is switched ON/OFF at a high speed.

A current on the primary side of the rectifier circuit 13 is detected by a CT 17. The detected current is input into the inverter control circuit 161 and used as an input signal for controlling the inverter 16.

A high-frequency voltage output from the inverter 16 is supplied to the primary winding 181 of the boosting transformer 18, so that a high voltage in proportion to the turn ratio in the boosting transformer 18 is obtained in a secondary winding 182 of the boosting transformer 18. A winding 183 having a small number of turns is further provided on the secondary side of the boosting transformer 18. The winding 183 is used for heating a filament 121 of a magnetron 12. The secondary winding 182 of the boosting transformer 18 is provided with a voltage doubler half-wave rectifier circuit 19 for rectifying the output of the secondary winding 182. The voltage doubler half-wave rectifier circuit 19 has a high-voltage capacitor 191, and two high-voltage diodes 192 and 193. In a positive cycle (e.g., on the assumption that the upper end of the secondary winding 182 in FIG. 1 is positive), a current flows in the high-voltage capacitor 191 and the high-voltage diode 192 so that left and right electrodes of the high-voltage capacitor 191 in FIG. 1 are charged positively and negatively respectively. Then, in a negative cycle (e.g., on the assumption that the lower end of the secondary winding 182 in FIG. 1 is positive), a current flows in the high-voltage diode 193 so that a doubled voltage which is the sum of a voltage from the high-voltage capacitor 191 previously charged and a voltage from the secondary winding 182 is applied between an anode 122 and a cathode 121 in the magnetron 12.

Although an example of the magnetron drive electric source using the boosting transformer as a subject of the invention has been described above, the drive electric source is not limited thereto. Any drive electric source may be used if it includes a transformer for boosting a high frequency.

With the needs of reduction in size of a microwave oven, it is necessary to reduce the size of a boosting transformer. Therefore, a low frequency heretofore used has begun to be replaced by a high frequency as described above. In a low frequency, a metal core (of an amorphous or silicon steel plate) advantageous in reduction in size, saturation and cost was used as a core in the transformer. In a high frequency, such a metal core has not been used because of large high-frequency loss and has begun to be replaced by a ferrite core.

FIG. 7 shows an example of the boosting transformer using ferrite cores. In FIG. 7, a primary winding 71, a secondary winding 72 and a heater winding 73 are disposed in parallel with one another on a common axis of two U-shaped ferrite cores 74 and 75 opposite to each other. In the case of a magnetron drive electric source often used for large electric power, a zero-volt switching method (hereinafter referred to as "ZVS method") using voltage resonance is prevailingly used for lightening the load imposed on power semiconductor. A gap G is provided because the coupling coefficient of the boosting transformer needs to be selected to be in a range of from about 0.6 to about 0.85 in order to obtain a resonance voltage by the ZVS method.

In the case of the related-art boosting transformer using two U-shaped ferrite cores 74 and 75 opposite to each other, however, the peak current flowing in the primary side of the boosting transformer needs to be increased more greatly in order to make the output of the magnetron higher. As a result, magnetic flux density is saturated easily because the ferrite cores are inferior in saturation magnetic flux density characteristic. Therefore, increase in size of the ferrite cores is required in order to prevent saturation. This becomes a barrier to the major premise that the size of the electric source needs to be reduced.

DISCLOSURE OF INVENTION

In order to solve these problems, an object of the invention is to provide a boosting transformer which contributes to reduction in size of an electric source and in which saturation is prevented in spite of a high output.

According to a first aspect of the invention, there is provided a magnetron drive boosting transformer for supplying a drive voltage to a magnetron, having: a rod-like ferrite core; and primary and secondary windings wound around the rod-like ferrite core; wherein the magnetron drive boosting transformer further has: a square-shaped core arranged opposite to the rod-like ferrite core through a gap so as to be fitted toward the rod-like ferrite core from the outside of the primary and secondary windings.

According to a second aspect of the invention, there is provided a magnetron drive boosting transformer for supplying a drive voltage to a magnetron, having: a rod-like ferrite core; and primary and secondary windings wound around the rod-like ferrite core; wherein the magnetron drive boosting transformer further has: a core shaped like a square-ring having one inner diameter larger than each of outer sizes of the primary and secondary windings and the other inner diameter larger than a total size of the primary and secondary windings piled up side by side, the square-shaped core being arranged opposite to the rod-like ferrite core through a gap so as to be fitted toward the rod-like ferrite core from the outside of the primary and secondary windings.

In the boosting transformer according to the invention as in first or second aspect of the invention, the ferrite core low in high-frequency loss is used as a main core while the square-shaped core disposed opposite to the ferrite core through a gap to prevent saturation is used for a magnetic path. Hence, the square-shaped core is easy to produce, small in size and hard and has an effect in mechanically protecting the outside of the respective windings.

According to a third aspect of the invention, there is provided a magnetron drive boosting transformer for supplying a drive voltage to a magnetron, having: a rod-like ferrite core; and primary and secondary windings wound around the rod-like ferrite core and piled up side by side in a is direction of an axis of the rod-like ferrite core; wherein the magnetron drive boosting transformer further has: a metal core formed from a long metal thin plate rolled by a plurality of times into a square-ring having one inner diameter larger than each of outer sizes of the primary and secondary windings and the other inner diameter larger than a total size of the primary and secondary windings piled up side by side, the metal core being arranged opposite to the rod-like ferrite core through a gap so as to be fitted toward the rod-like ferrite core from the outside of the primary and secondary windings.

In the boosting transformer according to the invention described previously, the ferrite core low in high-frequency loss is used as a main core while the metal core small-sized and higher in saturation magnetic flux density than the ferrite core is used so as to be opposite to the ferrite core through a gap to prevent saturation. Moreover, the metal core is formed in such a manner that metal thin plates are laminated to one another in a flow direction of eddy current to prevent eddy current from flowing to thereby take countermeasures against high-frequency loss. In addition, the metal core is shaped like a square-ring. Hence, the metal core is easy to produce, small in size and hard and has an effect in mechanically protecting the outside of the respective windings.

According to a fourth and fifth invention, there is provided a magnetron drive boosting transformer defined in any one of the first through third aspect, wherein the rod-like ferrite core is shaped like a rectangular parallelepiped.

According to the invention described previously, the gap formed between the rod-like ferrite core and the metal core has a constant width, so that the coupling coefficient or the like can be designed easily.

According to a sixth aspect of the invention, there is provided a magnetron drive boosting transformer defined in the fourth aspect of the invention, wherein the ferrite core shaped like a rectangular parallelepiped has a protrusion on a part of its surface opposite to the metal core, the protrusion being in contact with the metal core.

According to the invention described previously, it is unnecessary to provide a separate spacer between the rod-like ferrite core and the metal core, and labor and time for incorporating the spacer in the boosting transformer can be therefore omitted. Hence, the boosting transformer can be assembled easily so that the production cost of the boosting transformer can be reduced.

According to a seventh aspect of the invention, there is provided a magnetron drive boosting transformer for supplying a drive voltage to a magnetron, having: a rod-like ferrite core; and primary and secondary windings wound around the rod-like ferrite core; wherein the magnetron drive boosting transformer further has: a metal core shaped like a square-ring having one inner diameter larger than each of outer sizes of the primary and secondary windings and the other inner diameter larger than a length of the rod-like ferrite core, the rod-like ferrite core together with the primary and secondary windings being inserted into the square-ring-shaped metal core, the square-ring-shaped metal core being arranged opposite to the rod-like ferrite core through a gap between an axial end portion of the rod-like ferrite core and the metal core.

In the boosting transformer according to the invention described previously, the ferrite core low in high-frequency loss is used as a main core while the square-shaped core disposed opposite to the ferrite core through a gap to prevent saturation is used for a magnetic path. Hence, the square-shaped core is easy to produce, small in size and hard and has an effect in mechanically protecting the outside of the respective windings.

According to an eighth aspect of the invention, there is provided a magnetron drive boosting transformer for supplying a drive voltage to a magnetron, having: a rod-like ferrite core; and primary and secondary windings wound around the rod-like ferrite core; wherein the magnetron drive boosting transformer further has: a metal core formed from a laminate of a plurality of square-ring-shaped metal thin plates in a direction of thickness thereof, the metal core being shaped like a square-ring having one inner diameter larger than each of outer sizes of the primary and secondary windings and the other inner diameter larger than a length of the rod-like ferrite core, the rod-like ferrite core together with the primary and secondary windings being inserted into the metal core, the metal core being arranged opposite to the rod-like ferrite core through a gap between an axial end portion of the rod-like ferrite core and the metal core.

In the boosting transformer according to the invention described previously, the ferrite core low in high-frequency loss is used as a main core while the metal core small-sized and hardly saturated is used so as to be opposite to the ferrite core through a gap to prevent saturation. Moreover, the metal core is formed in such a manner that metal thin plates are laminated to one another in a flow direction of eddy current so as to prevent eddy current from flowing. In addition, the metal core is shaped like a square-ring. Hence, the metal core is easy to produce and hard, and has an effect in guarding the respective windings.

According to a ninth aspect of the invention, there is provided a magnetron drive boosting transformer defined in the seventh or eighth aspect of the invention, wherein the rod-like ferrite core is columnar.

According to the invention described previously, when the rod-like ferrite core is made columnar, the ferrite core has an effect in simplifying production. Further, the gap formed between the rod-like ferrite core and the metal core 27 has a constant width, so that the coupling coefficient or the like can be designed easily.

According to a tenth aspect of the invention, there is provided a magnetron drive boosting transformer defined in any one of the first through ninth aspect of the invention, wherein magnetic reluctance is changed by the gap between the rod-like ferrite core and the core.

According to the invention described previously, the coupling coefficient of the boosting transformer can be adjusted easily to any optimum value.

In order to solve these problems, according to a eleventh aspect of the invention, there is provided a magnetron drive boosting transformer for supplying a drive voltage to a magnetron, having: a rod-like ferrite core; and primary and secondary windings wound around the rod-like ferrite core; wherein the magnetron drive boosting transformer further has: a square-ring shaped iron oxide powder resin core containing iron oxide powder sealed with a resin, the square-ring shaped iron oxide powder resin core being fitted toward the rod-like ferrite core from the outside of the primary and secondary windings and being disposed opposite to the rod-like ferrite core through a gap formed between the square-ring shaped iron oxide powder resin core and the rod-like ferrite core.

According to a twelfth aspect of the invention, there is provided a magnetron drive boosting transformer for supplying a drive voltage to a magnetron, having: a rod-like ferrite core; and primary and secondary windings wound around the rod-like ferrite core and piled up side by side in a direction of an axis of the rod-like ferrite core; wherein the magnetron drive boosting transformer further has: a square-ring shaped iron oxide powder resin core containing iron oxide powder sealed with a resin, the iron oxide powder resin core being shaped like a rectangular ring having one inner size larger than each of outer sizes of the primary and secondary windings and the other inner size larger than a total size of the primary and secondary windings piled up side by side, the iron oxide powder resin core being fitted toward the rod-like ferrite core from the outside of the primary and secondary windings and being disposed opposite to the rod-like ferrite core through a gap formed between the iron oxide powder resin core and the rod-like ferrite core.

In the boosting transformer according to the invention described previously, there is used the core of iron oxide powder sealed with a resin, which is low in high-frequency loss, which can be made smaller in cost and size than the ferrite core and which is higher in saturation magnetic flux density than the ferrite core. Moreover, a gap is provided between the ferrite core and the iron oxide powder resin core to prevent saturation. Hence, the iron oxide powder resin core is easy to produce, small in size and hard and has an effect in mechanically protecting the outside of the respective windings.

According to a third aspect of the invention, there is provided a magnetron drive boosting transformer defined in the first or second aspect of the invention, wherein the rod-like ferrite core is shaped like a rectangular parallelepiped.

According to the invention described previously, because the gap formed between the rectangular parallelepiped ferrite core and the square-ring shaped iron oxide powder resin core has a constant width, it is easy to design the coupling coefficient or the like.

According to a fourteenth aspect of the invention, there is provided a magnetron drive boosting transformer for supplying a drive voltage to a magnetron, having: a rod-like ferrite core; and primary and secondary windings wound around the rod-like ferrite core and piled up side by side in a direction of an axis of the rod-like ferrite core; wherein the magnetron drive boosting transformer further has: a square-ring shaped iron oxide powder resin core containing iron oxide powder sealed with a resin, the iron oxide powder resin core being shaped like a rectangular ring having one inner size larger than each of outer sizes of the primary and secondary windings and the other inner size larger than a length of the rod-like ferrite core, the square-ring shaped iron oxide powder resin core being fitted onto the rod-like ferrite core and being disposed opposite to the rod-like ferrite core through a gap formed between an axial end portion of the rod-like ferrite core and the square-ring shaped iron oxide powder resin core.

In the boosting transformer according to the invention described previously, there is used the core of iron oxide powder sealed with a resin, which is low in high-frequency loss, which can be made smaller in cost and size than the ferrite core and which is higher in saturation magnetic flux density than the ferrite core. Moreover, a gap is provided between the axial end portion of the ferrite core and the iron oxide powder resin core to prevent saturation. Hence, the iron oxide powder resin core is easy to produce, small in size and hard and has an effect in mechanically protecting the outside of the respective windings.

According to a fifteenth aspect of the invention, there is provided a magnetron drive boosting transformer defined in fourteenth aspect of the invention, wherein the rod-like ferrite core is columnar.

According to the invention described previously, when the rod-like ferrite core is made columnar, there is an effect in simplifying production. Moreover, because the gap formed between the rod-like ferrite core and the metal core has a constant width, it is easy to design the coupling coefficient or the like.

According to a sixteenth aspect of the invention, there is provided a magnetron drive boosting transformer defined in any one of the eleventh through fifteenth aspect, wherein the rod-like ferrite core is replaced by a rod-like iron oxide powder resin core containing iron oxide powder sealed with a resin.

In the boosting transformer according to the invention described previously, when a rod-like iron oxide powder resin core containing iron oxide powder sealed with a resin is used as a core, the core can be produced from the same material as that of the square-ring shaped iron oxide powder resin core. Hence, operations such as purchase of raw material, production and management can be made easily.

According to a seventeenth aspect the invention, there is provided a magnetron drive boosting transformer defined in the thirteenth aspect, wherein a protrusion is formed on a part of a surface of the rectangular parallelepiped core opposite to the square-ring shaped iron oxide powder resin core so that the protrusion is brought into contact with the square-ring shaped iron oxide powder resin core.

According to a eighteenth aspect of the invention, there is provided a magnetron drive boosting transformer defined in the seventeenth aspect, wherein the rod-like ferrite core is replaced by a rod-like iron oxide powder resin core containing iron oxide powder sealed with a resin.

According to the invention described previously, it is unnecessary to prepare any spacer separately between the cores and labor and time for incorporating the spacer in the boosting transformer can be omitted. Hence, the boosting transformer can be assembled easily, so that the production cost of the boosting transformer can be reduced.

According to a nineteenth aspect of the invention, there is provided a magnetron drive boosting transformer for supplying a drive voltage to a magnetron, having: a primary winding; and a secondary winding; wherein the magnetron drive boosting transformer further has: two U-shaped iron oxide powder resin cores each containing iron oxide powder sealed with a resin, the two U-shaped iron oxide powder resin cores being disposed opposite to each other through a gap formed between forward ends of U figures of the two U-shaped iron oxide powder resin cores, respective one-leg portions of the two U-shaped iron oxide powder resin cores being butt-jointed to each other to thereby form a core around which the primary and secondary windings are provided.

According to a twentieth aspect of the invention, there is provided a magnetron drive boosting transformer for supplying a drive voltage to a magnetron, having: a primary winding; and a secondary winding; wherein the magnetron drive boosting transformer further has: two U-shaped iron oxide powder resin cores each containing iron oxide powder sealed with a resin, the two U-shaped iron oxide powder resin cores being disposed opposite to each other through a gap formed between forward ends of U figures of the two U-shaped iron oxide powder resin cores, respective one-leg portions of the two U-shaped iron oxide powder resin cores being butt-jointed to each other to thereby form a core around which the primary and secondary windings are wound so as to be piled up side by side in a direction of an axis of the core.

In the boosting transformer according to the invention described previously, there is used a core of iron oxide powder sealed with a resin, which is low in high-frequency loss and which can be made smaller in cost and size than a ferrite core and which is higher in saturation magnetic flux density than the ferrite core. Hence, there can be obtained a boosting transformer easy to produce, small in size and cost and hard.

Figure 1:
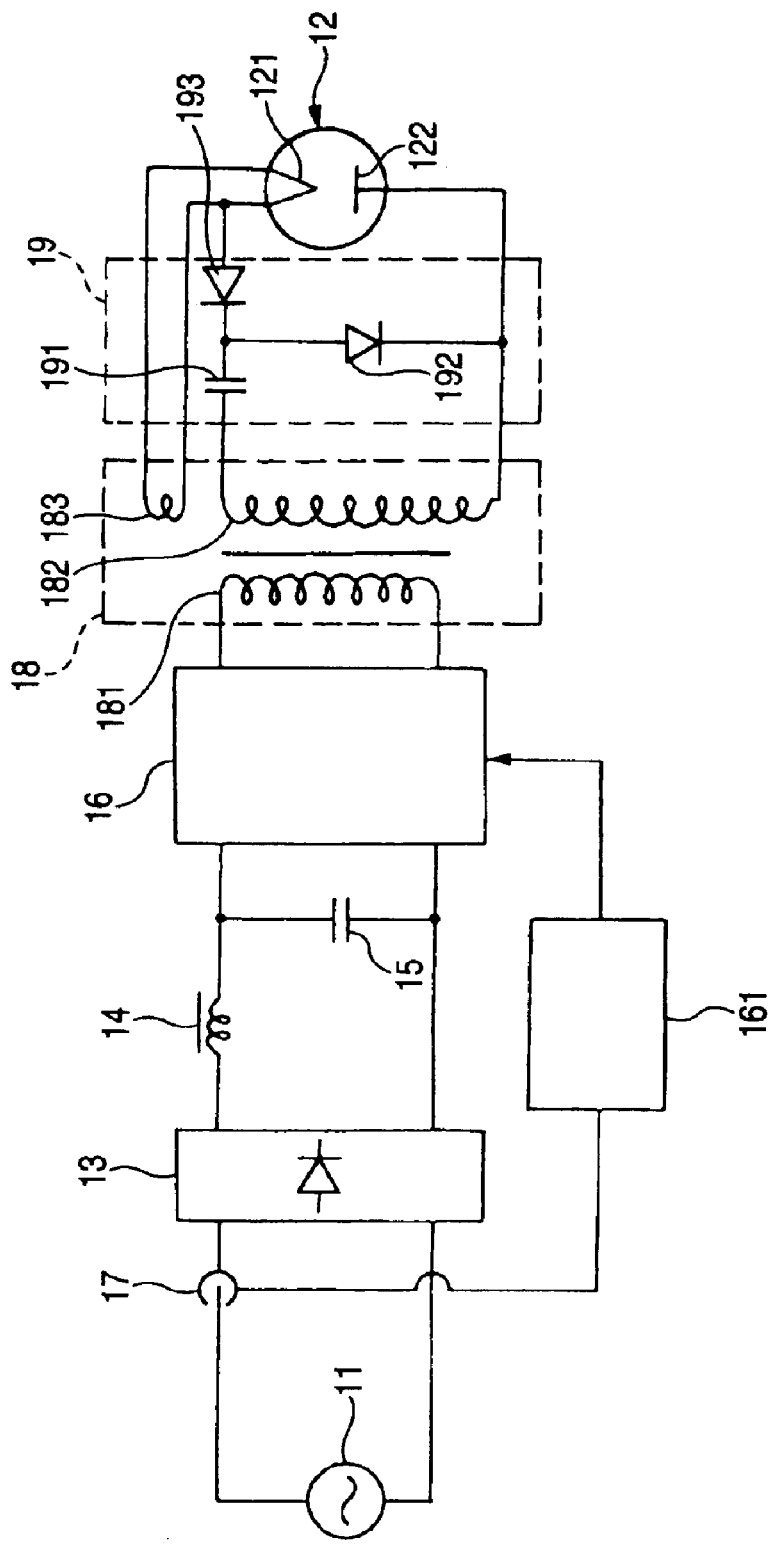
FIG. 1 is a configuration diagram of a magnetron drive electric source using a boosting transformer as a subject of the invention.

In the figures, reference numeral 11 refers to a commercial electric source; 12 to a magnetron; 122 to an anode; 121 to a cathode; 13 to a rectifier circuit; 14 to a choke coil; 15 to a filter capacitor; 16 to an inverter; 161 to an inverter control circuit; 17 to a CT; 18 to a boosting transformer; 181 to a primary winding; 182 to a secondary winding; 183 to a filament heating winding; 19 to a voltage doubler half-wave rectifier circuit; 191 to a high-voltage capacitor; 192, 193 to a high-voltage diode; 20 to a boosting transformer according to first embodiment; 21 to a primary winding; 22 to a secondary winding; 23 to a heater winding; 26 to a rectangular parallelepiped ferrite core; 26a to a protrusion portion; 27 to a metal-core; 27a to a long metal thin plate; 56 to a columnar ferrite core; 57 to a metal-core; 57a to a square-ring shaped metal thin plate; 220 to a boosting transformer according to first embodiment; 221 to a primary winding; 222 to a secondary winding; 223 to a heater winding; 226 to a rectangular parallelepiped ferrite core; 227 to a square-ring shaped iron oxide powder resin core; 230 to a boosting transformer; 236 to a columnar ferrite core; 237 to an iron oxide powder resin core; 240, 240' to boosting transformer; 246 to a rectangular parallelepiped iron oxide powder resin core; 246' to a columnar iron oxide powder resin core; 247, 247' to square-ring shaped iron oxide powder resin core containing iron oxide powder sealed with resin; 250 a boosting transformer; 256 to a rectangular parallelepiped ferrite core; 256a to a protrusion portion; 260 boosting transformer; 264, 265 to U-shaped iron oxide powder resin core; and G to a gap.

BEST MODE FOR CARRYING OUT THE INVENTION

A boosting transformer according to the invention will be described below with reference to FIGS. 2A to 10D.
(First Embodiment)

Figure 2A:
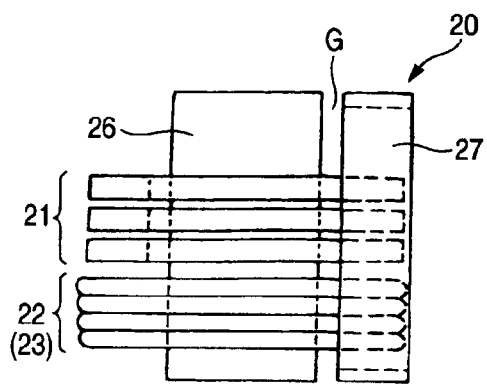
FIG. 2A is a front view showing a boosting transformer according to a first embodiment of the invention.
Figure 2B:
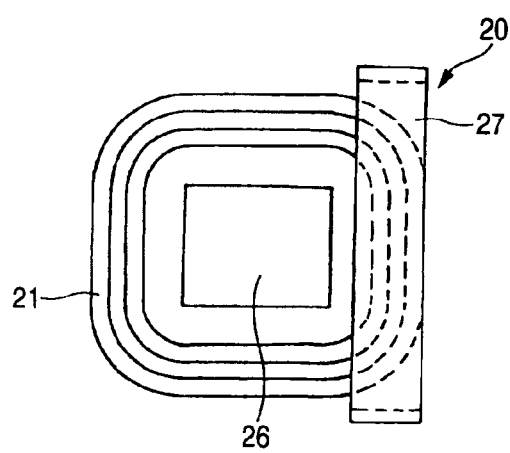
FIG. 2B is a plan view showing the boosting transformer.
Figure 2C:
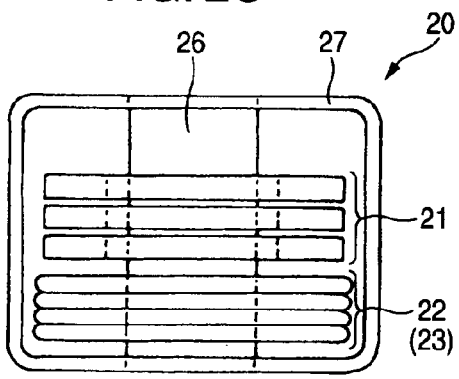
FIG. 2C is a side view showing the boosting transformer.
Figure 2D:
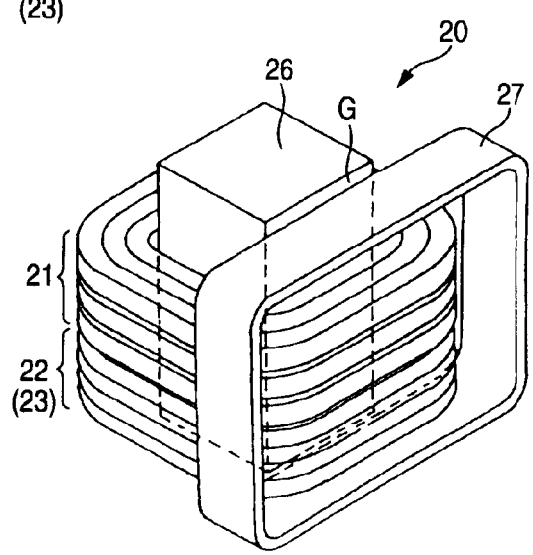
FIG. 2D is a perspective view showing the boosting transformer.

FIG. 2A is a front view showing a boosting transformer according to a first embodiment of the invention. FIG. 2B is a plan view showing the boosting transformer. FIG. 2C is a side view showing the boosting transformer. FIG. 2D is a perspective view showing the boosting transformer. In FIGS. 2A to 2D, the boosting transformer 20 according to the first embodiment of the invention has a primary winding 21, a secondary winding 22, and a heater winding 23. The winding sectional area of the primary winding 21 is larger than that of the secondary winding 22. The number of turns in the primary winding 21 is smaller than that in the secondary winding 22. The heater winding 23 is not shown in FIGS. 2A to 2D because the number of turns in the heater winding 23 is extremely smaller than that of the secondary winding 22. The heater winding 23 need not be an essential part of the boosting transformer 20 because the heater winding 23 may be formed as a part separate from the boosting transformer 20. The reference numeral 26 designates a rod-like ferrite core. In this embodiment, the ferrite core 26 is shaped like a rectangular parallelepiped. The primary winding 21, the secondary winding 22 and the heater winding 23 are wound around the rectangular parallelepiped ferrite core 26 and arranged side by side in a direction of an axis of the core.

Figure 3A:
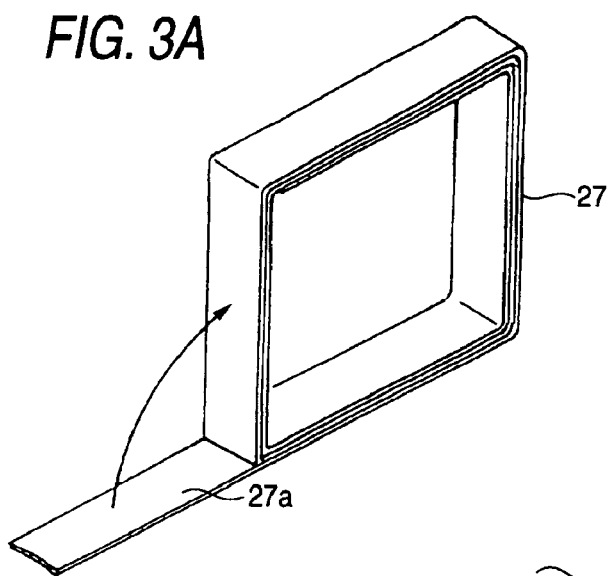
FIGS. 3A and 3B are views for explaining a metal core forming method used in the invention.

The reference numeral 27 designates a metal core used in the invention. As shown in FIG. 3A, the metal core 27 is formed in such a manner that a long metal thin plate 27a of amorphous, silicon steel or the like is rolled by a plurality of times (about 10 times to about 40 times) into a square-ring while layers of the thin plate 27a are electrically insulated from one another. Moreover, the metal core 27 is shaped like a square-ring having one inner size (in a left-and-right direction of the metal core 27 in FIG. 2C) larger than each of outer sizes of the primary winding 21, the secondary winding 22 and the heater winding 23, and the other inner size (in an up-and-down direction of the metal core 27 in FIG. 2C) larger than a total size of the three windings (that is, the primary winding 21, the secondary winding 22 and the heater winding 23) piled up side by side.

Hence, as shown in FIG. 2D, the metal core 27 is fitted toward the ferrite core 26 from the outside of the primary, secondary and heater windings 21, 22 and 23 and arranged opposite to the ferrite core 26 through a gap G secured by a spacer (not shown) disposed between the metal core 27 and the rod-like ferrite core 26. The gap between the ferrite core 26 and the metal core 27 is selected to be about 0.3 mm to about 0.8 mm.

Figure 11:
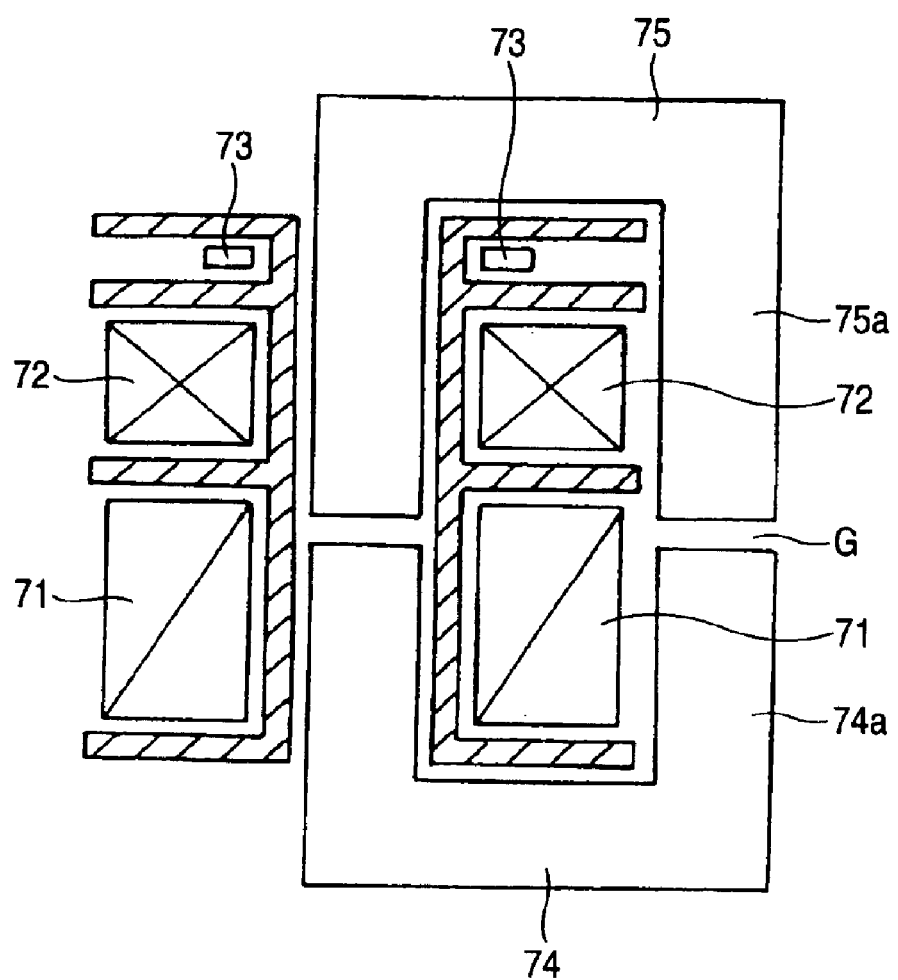
FIG. 11 is a view showing a related-art boosting transformer using ferrite cores.

In the configuration, the ferrite core low in high-frequency loss is used as a main core and the metal core small-sized and hardly saturated is disposed on the outside of the primary, secondary and heater windings 21, 22 and 23 SO as to be opposite to the ferrite core through a gap to prevent saturation. Hence, the boosting transformer 20 greatly contributes to reduction in size compared with the related-art boosting transformer (FIG. 11) having only ferrite cores. That is, in the related-art boosting transformer, the ferrite core portions 74a and 75a disposed on the outside of the primary, secondary and heater windings 21, 22 and 23 are formed to have sectional areas substantially equal to those of the main ferrite core portions, so that the ferrite core portions 74a and 75a protrude out largely from the primary, secondary and heater windings 21, 22 and 23. On the contrary, in the boosting transformer 20 according to the first embodiment of the invention, the sectional area of the metal core can be selected to be extremely smaller than that of the ferrite core portion, so that the metal core does not protrude out largely from the primary, secondary and heater windings 21, 22 and 23 (see FIG. 2C).

Moreover, high-frequency loss which is a drawback of the metal core in a high frequency can be reduced as follows. As shown in FIG. 3A, the metal core is formed from a long metal thin plate 27a rolled by 10–40 times, so that the flow direction of eddy current is adjusted to a direction of crossing metal thin plate layers rolled by such a plurality of times. Hence, eddy current can flow only in the sectional area of one metal thin plate. Moreover, the sectional area of one metal thin plate is large in resistance. Hence, eddy current can little flow in the metal core. Accordingly, when the metal core configured as described above is disposed as described above, high-frequency loss can be only reduced in spite of a high frequency. Hence, a boosting transformer having both the advantage of the ferrite core and the advantage of the metal core can be obtained.

Moreover, because the ferrite core of the boosting transformer is shaped like a rectangular parallelepiped, respective opposite portions of the ferrite core 26 and the metal core 27 are parallel with each other. Hence, the gap G formed between the ferrite core 26 and the metal core 27 has a constant width, so that the coupling coefficient or the like can be designed easily.

Although it may be conceived that the square-ring shaped metal core is replaced by a U-shaped metal core, the square-ring shaped metal core can be produced more easily than the U-shaped metal core and has a secondary effect in mechanically protecting the respective windings because the square-ring shaped metal core partially envelops the respective windings from the outside.

Although this embodiment has shown the case where the primary winding 21, the secondary winding 22 and the heater winding 23 are wound around the rod-like ferrite core and piled up side by side in a direction of an axis of the core, the invention is not limited thereto but may be applied to the case where the three windings are disposed concentrically on the rod-like ferrite core so that a second winding is wound on a first winding and a third winding is wound on the second winding.

(Second Embodiment)

Figure 4A:
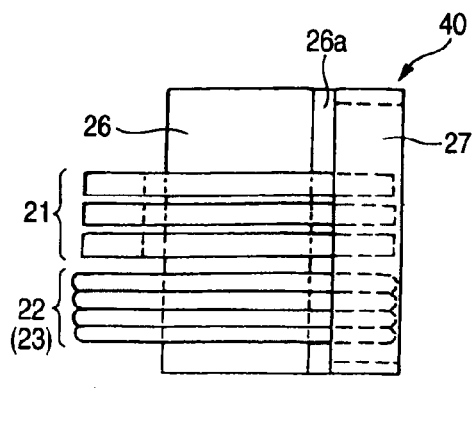
FIG. 4A is a front view showing a boosting transformer according to a second embodiment of the invention.
Figure 4B:
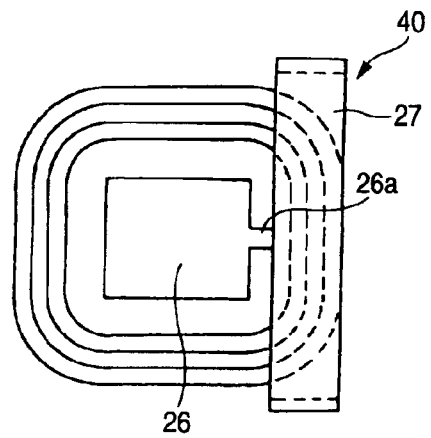
FIG. 4B is a plan view showing the boosting transformer.
Figure 4C:
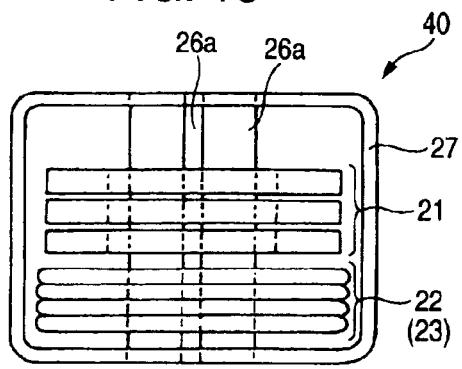
FIG. 4C is a side view showing the boosting transformer.
Figure 4D:
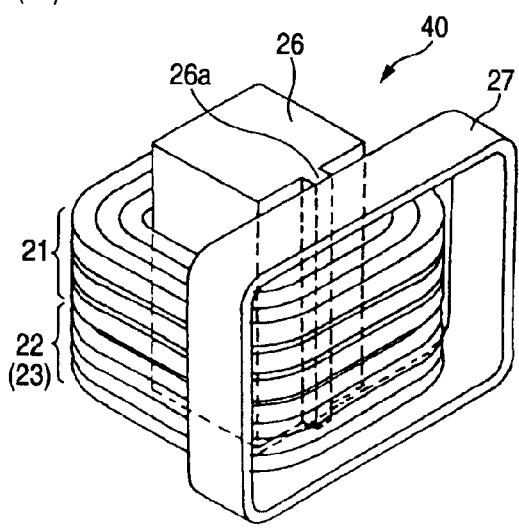
FIG. 4D is a perspective view showing the boosting transformer.

FIG. 4A is a front view showing a boosting transformer according to a second embodiment of the invention. FIG. 4B is a plan view showing the boosting transformer. FIG. 4C is a side view showing the boosting transformer. FIG. 4D is a perspective view showing the boosting transformer. In FIGS. 4A to 4D, like FIGS. 2A to 2D, the boosting transformer 40 according to the second embodiment of the invention has a primary winding 21, a secondary winding 22 and a heater winding 23. That is, the winding sectional area of the primary winding 21 is larger than that of the secondary winding 22. The number of turns in the primary winding 21 is smaller than that in the secondary winding 22. The heater winding 23 is not shown in FIGS. 4A to 4D because the number of turns in the heater winding 23 is extremely smaller than that in the secondary winding 22. The reference numeral 26 designates a ferrite core shaped like a rectangular parallelepiped. The primary winding 21, the secondary winding 22 and the heater winding 23 are wound around the rectangular parallelepiped ferrite core 26 and piled up side by side in a direction of an axis of the core. The reference numeral 27 designates a metal core the same as in FIGS. 2A to 2D. That is, as shown in FIG. 3A, the metal core 27 is formed in such a manner that a long metal thin plate 27a is rolled by about 10 times to about 40 times into a square-ring. Moreover, the metal core 27 is shaped like a square-ring having one inner size (in a left-and-right direction of the metal core 27 in FIG. 4C) larger than each of outer sizes of the primary winding 21, the secondary winding 22 and the heater winding 23, and the other inner size (in an up-and-down direction of the metal core 27 in FIG. 4C) larger than a total size of the three windings (that is, the primary winding 21, the second winding 22 and the heater winding 23) piled up side by side.

In the boosting transformer according to the second embodiment of the invention, a protrusion 26a is formed on a part of a surface of the rectangular parallelepiped ferrite core 26 opposite to the metal core 27. The height of the protrusion 26a is substantially equal to the width of the gap G shown in FIGS. 2A to 2D. Because the gap G to be secured between the rectangular parallelepiped ferrite core 26 and the metal core 27 can be secured by the protrusion 26a, it is unnecessary to use the spacer used in FIGS. 2A to 2D. Hence, it is unnecessary to provide the spacer separately and process for incorporating the spacer in the boosting transformer can be omitted. Hence, the boosting transformer can be assembled easily.

The protrusion 26a is formed so that the cross-sectional area in a passing direction of a magnetic path is selected to be small. That is, magnetic flux density is saturated with slight magnetic flux and a magnetic short circuit is prevented from being formed.

Although FIGS. 4A to 4D show the case where one protrusion 26a is formed in the central portion of a side of the rectangular parallelepiped ferrite core 26, the invention may be also applied to the case where a pair of protrusions 26a are formed at opposite end portions respectively on a side of the rectangular parallelepiped ferrite core 26 so that the pair of protrusions 26a are brought into contact with the metal core 27 at two points. In this case, stability of assembling can be made better.

(Third Embodiment)

Figure 5A:
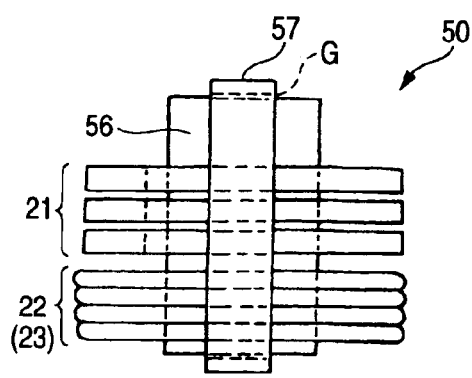
FIG. 5A is a front view showing a boosting transformer according to a third embodiment of the invention.
Figure 5B:
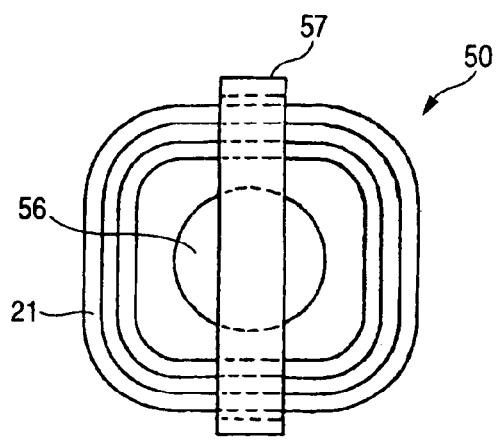
FIG. 5B is a plan view showing the boosting transformer.
Figure 5C:
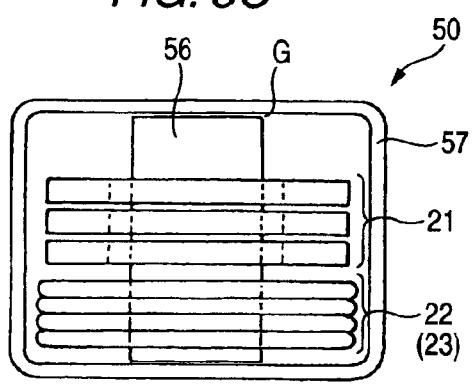
FIG. 5C is a side view showing the boosting transformer.
Figure 5D:
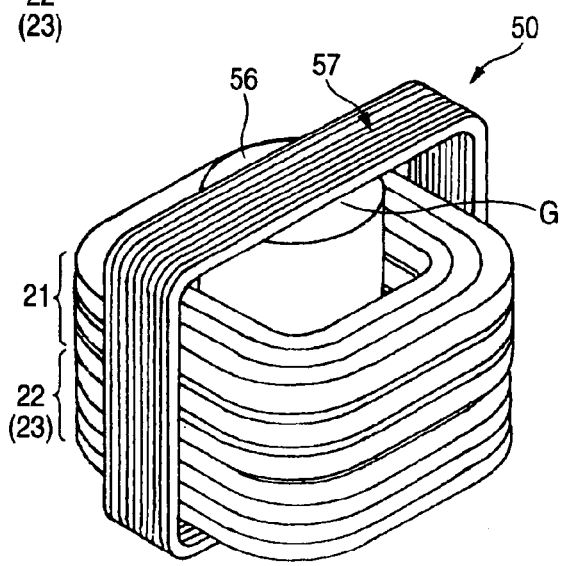
FIG. 5D is a perspective view showing the boosting transformer.

FIG. 5A is a front view showing a boosting transformer according to a third embodiment of the invention. FIG. 5B is a plan view showing the boosting transformer. FIG. 5C is a side view showing the boosting transformer. FIG. 5D is a perspective view showing the boosting transformer. In FIGS. 5A to 5D, like FIGS. 2A to 2D, the boosting transformer 50 according to the third embodiment of the invention has a primary winding 21, a secondary winding 22 and a heater winding 23. That is, the winding sectional area of the primary winding 21 is larger than that of the secondary winding 22. The number of turns in the primary winding 21 is smaller than that in the secondary winding 22. The heater winding 23 is not shown in FIGS. 5A to 5D because the number of turns in the heater winding 23 is extremely smaller than that in the secondary winding 22.

A columnar ferrite core 56 is used in the boosting transformer according to the third embodiment of the invention. The primary winding 21, the secondary winding 22 and the heater winding 23 are wound around the columnar ferrite core 56 and piled up side by side in a direction of an axis of the core.

Figure 3B:
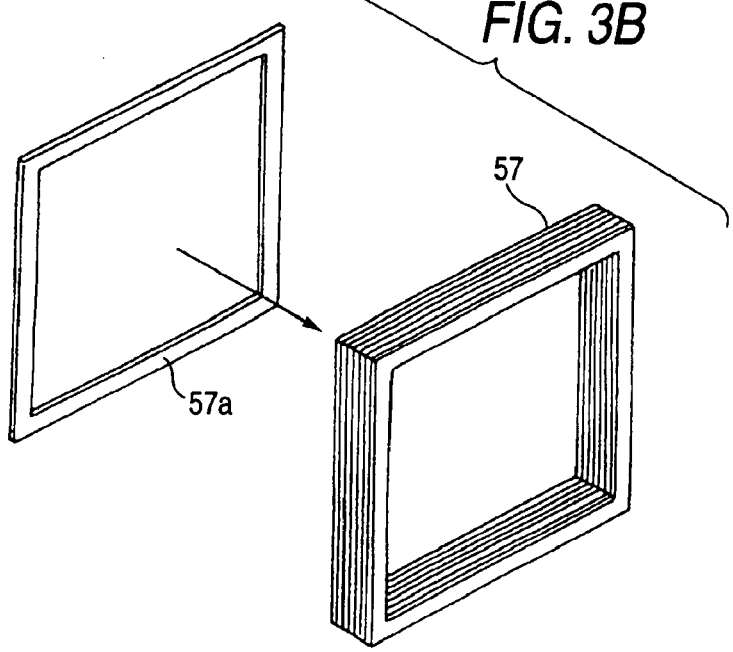

Moreover, as shown in FIG. 3B, a metal core 57 of the boosting transformer is formed in such a manner that a plurality of square-ring shaped metal thin plates 57a (10 to 40 metal thin plates) are laminated to one another in the direction of thickness thereof through an electrically insulating adhesive agent. The square-ring shaped metal core 57 has one inner size (in a left-and-right direction of the metal core 57 in FIG. 5C) larger than each of outer sizes of the primary, secondary and heater windings 21, 22 and 23, and the other inner size (in an up-and-down direction of the metal core 57 in FIG. 5C) larger than the length of the columnar ferrite core 56. As shown in FIG. 5D, the metal core 57 is fitted onto the columnar ferrite core 56 and disposed opposite to an axial end portion of the columnar ferrite core 56 through a gap G.

In the configuration, the ferrite core low in high-frequency loss is used as a main core and the metal core small-sized and hardly saturated is disposed on the outside of the primary, secondary and heater windings 21, 22 and 23 and the ferrite core 56 so as to be opposite to the ferrite core through a gap to prevent saturation. Hence, the boosting transformer 50 greatly contributes to reduction in size compared with the related-art boosting transformer (FIG. 11) having only ferrite cores 74 and 75. That is, in the boosting transformer 50 according to the third embodiment of the invention, the sectional area of the metal core can be selected to be extremely smaller than that of the ferrite core portion, so that the metal core does not protrude out largely from the primary, secondary and heater windings 21, 22 and 23 (see FIG. 5C).

Moreover, high-frequency loss which is a drawback of the metal core 57 in a high frequency can be reduced as follows.

As shown in FIG. 3B, the metal core 57 is formed from a laminate of 10 to 40 long metal thin plates 27a. The flow direction of eddy current is adjusted to a direction of crossing a plurality of metal thin plate layers formed by lamination. Hence, eddy current can flow only in the sectional area of one metal thin plate. Moreover, the sectional area of one metal thin plate is large in resistance. Hence, eddy current can little flow in the metal core.

Accordingly, when the metal core 57 configured as described above is disposed as described above, high-frequency loss can be only reduced in spite of a high frequency. Hence, a boosting transformer having both the advantage of the ferrite core and the advantage of the metal core can be obtained.

Moreover, because the ferrite core of the boosting transformer is columnar, the columnar ferrite core can be produced more easily than the rectangular parallelepiped ferrite core and respective opposite portions of the ferrite core 56 and the metal core 57 are parallel with each other. Hence, the gap G which is formed between the ferrite core 56 and the metal core 57 and through which magnetic flux passes has a constant width, so that the coupling coefficient or the like can be designed easily.

Moreover, the square-ring shaped metal core 57 has a function for mechanically protecting the ferrite core 56 and the respective windings 21, 22 and 23 because the square-ring shaped metal core 57 partially envelops the ferrite core 56 and the respective windings 21, 22 and 23 from the outside.

Although the square-ring shaped metal core 27 or 57 shown in FIG. 3A or 3B expresses the best mode in terms of high-frequency loss or the like, the metal core need not be used and any material may be used if the material is low in high-frequency loss. For example, it is a matter of course that a square-ring shaped core formed from ferrite or the like may be used in FIGS. 2A to 2D, FIGS. 4A to 4D and FIGS. 5A to 5D.

(Fourth Embodiment)

Figure 6A:
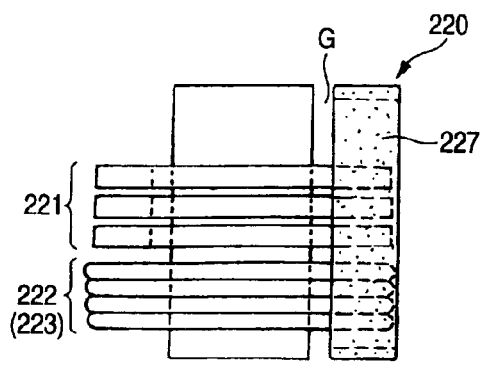
FIG. 6A is a front view showing a boosting transformer according to a fourth embodiment of the invention.
Figure 6B:
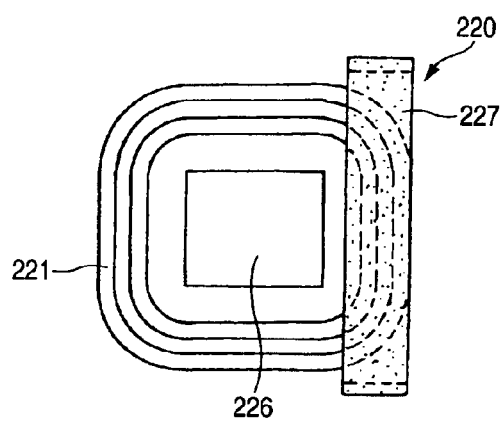
FIG. 6B is a plan view showing the boosting transformer.
Figure 6C:
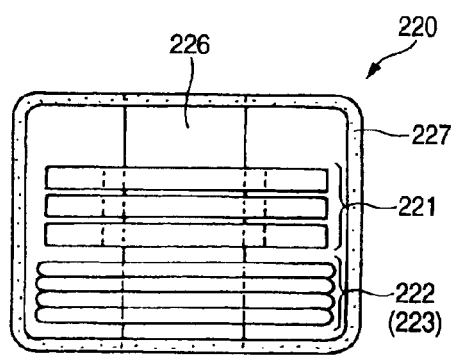
FIG. 6C is a side view showing the boosting transformer.
Figure 6D:
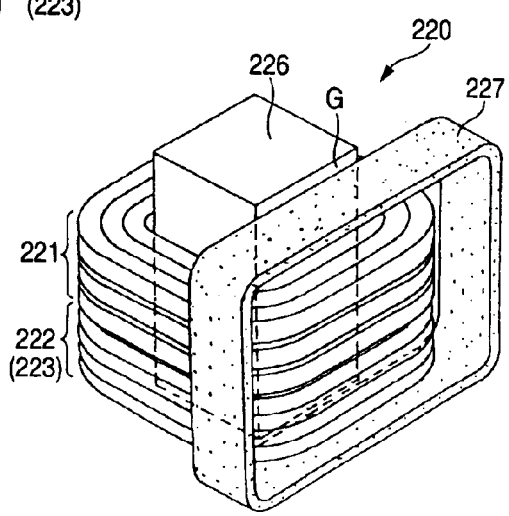
FIG. 6D is a perspective view showing the boosting transformer.

FIG. 6A is a front view showing a boosting transformer according to a fourth embodiment of the invention. FIG. 6B is a plan view showing the boosting transformer. FIG. 6C is a side view showing the boosting transformer. FIG. 6D is a perspective view showing the boosting transformer. In FIGS. 6A to 6D, the boosting transformer 220 according to the fourth embodiment of the invention has a primary winding 221, a secondary winding 222, and a heater winding 223. The winding sectional area of the primary winding 221 is larger than that of the secondary winding 222. The number of turns in the primary winding 221 is smaller than that in the secondary winding 222. The heater winding 223 is not shown in FIGS. 6A to 6D because the number of turns in the heater winding 223 is extremely smaller than that of the secondary winding 222. The heater winding 223 need not be an essential part of the boosting transformer 220 because the heater winding 223 may be formed as a part separate from the boosting transformer 220. The reference numeral 226 designates a rod-like ferrite core. In this embodiment, the ferrite core 226 is shaped like a rectangular parallelepiped. The primary winding 221, the secondary winding 222 and the heater winding 223 are wound around the rectangular parallelepiped ferrite core 226 and arranged side by side in a direction of an axis of the core.

The reference numeral 227 designates a square-ring shaped iron oxide powder resin core which is used in the invention and which contains iron oxide powder sealed with a resin. The iron oxide powder resin core 227 is shaped like a rectangular ring having one inner size (in a left-and-right direction of the iron oxide powder resin core 227 in FIG. 6C) larger than each of outer sizes of the primary winding 221, the secondary winding 222 and the heater winding 223, and the other inner size (in an up-and-down direction of the iron oxide powder resin core 227 in FIG. 6C) larger than a total size of the three windings (that is, the primary winding 221, the secondary winding 222 and the heater winding 223) piled up side by side.

As the iron oxide powder herein used, there is preferably used powder of particles having a particle size of not larger than about 0.5 mm and each coated with a highly electrically insulating film (oxide film). Examples of the resin preferably used include PPS (polyphenylene sulfide), PET (polyethylene terephthalate) and PP (polypropylene) heat-resistant to a temperature of about 100° C. When about 70% or more by weight of iron oxide are mixed with one of these resins, saturation magnetic flux density characteristic and magnetic permeability more excellent than those of ferrite can be obtained.

As described above, a magnetic circuit higher in magnetic permeability and higher in saturation magnetic flux density than ferrite can be obtained when iron oxide powder of particles having a particle size of not larger than about 0.5 mm is used. Hence, reduction in size can be achieved even in the application for use in the case of large electric power. Moreover, because iron oxide powder of particles each coated with an oxide film is used, it is hard to form a closed circuit in which eddy current generated by a high frequency flows. Hence, high-frequency loss can be reduced to be equal to that in ferrite. In this manner, the iron oxide powder resin core can have both the advantage of the ferrite core and the high saturation magnetic flux density of pure iron.

Hence, as shown in FIG. 6D, the iron oxide powder resin core 227 is fitted toward the ferrite core 226 from the outside of the primary, secondary and heater windings 221, 222 and 223 and arranged opposite to the ferrite core 226 through a gap G secured by a spacer (not shown) disposed between the iron oxide powder resin core 227 and the rod-like ferrite core 226. The gap between the ferrite core 226 and the iron oxide powder resin core 227 is selected to be in a range of from about 0.3 mm to about 0.8 mm.

In the configuration, the ferrite core 226 low in high-frequency loss is used as a main core and the iron oxide powder resin core 227 small-sized and hardly saturated is disposed on the outside of the primary, secondary and heater windings 221, 222 and 223 so as to be opposite to the ferrite core 226 through the gap G to prevent saturation. Hence, the boosting transformer 220 greatly contributes to reduction in size compared with the related-art boosting transformer (FIG. 11) having only ferrite cores. That is, in the boosting transformer 220 according to the fourth embodiment of the invention, the sectional area of the iron oxide powder resin core can be selected to be extremely smaller than that of the ferrite core portion, so that the iron oxide powder resin core does not protrude out largely from the primary, secondary and heater windings 221, 222 and 223 (see FIG. 6C). In addition, the iron oxide powder resin core 227 is low in high-frequency loss.

Moreover, because the ferrite core 226 of the boosting transformer is shaped like a rectangular parallelepiped, respective opposite portions of the ferrite core 226 and the iron oxide powder resin core 227 are parallel with each other. Hence, the gap G formed between the ferrite core 226 and the iron oxide powder resin core 227 has a constant width, so that the coupling coefficient or the like can be designed easily.

Moreover, because the iron oxide powder resin core 227 is shaped like a rectangular ring, it is easy to produce the iron oxide powder resin core 227. The square-ring shaped iron oxide powder resin core 227 also has an effect in mechanically protecting the respective windings because the square-ring shaped iron oxide powder resin core 227 partially envelops the respective windings 221, 222 and 223 from the outside.

Although this embodiment has shown the case where the primary, secondary and heater windings 221, 222 and 223 are wound around the rod-like ferrite core and piled up side by side in a direction of an axis of the core, the invention is not limited thereto but may be also applied to the case where the three windings are disposed concentrically on the rod-like ferrite core so that a second winding is wound on a first winding and a third winding is wound on the second winding.

(Fifth Embodiment)

Figure 7A:
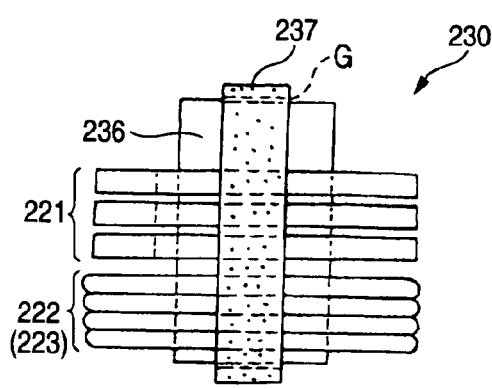
FIG. 7A is a front view showing a boosting transformer according to a fifth embodiment of the invention.
Figure 7B:
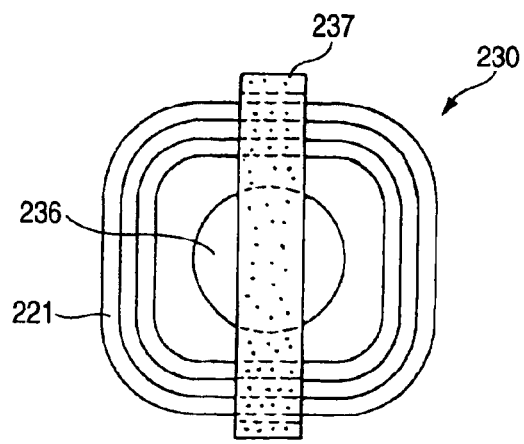
FIG. 7B is a plan view showing the boosting transformer.
Figure 7C:
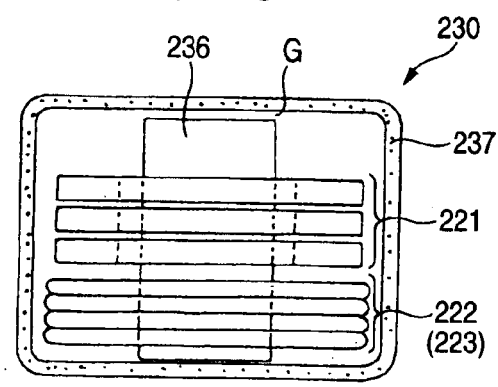
FIG. 7C is a side view showing the boosting transformer.
Figure 7D:
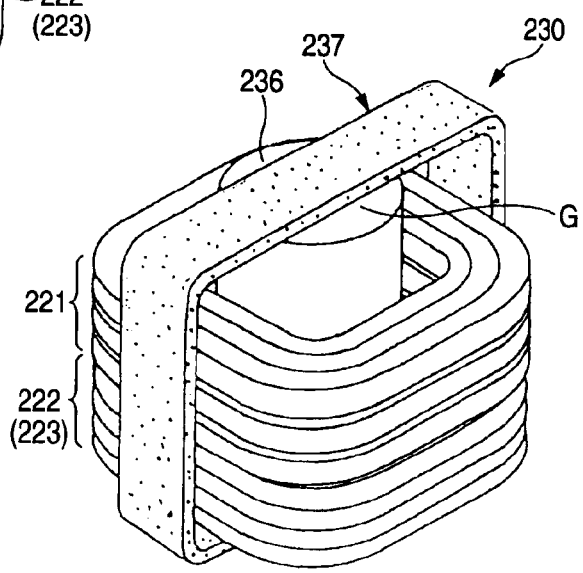
FIG. 7D is a perspective view showing the boosting transformer.

FIG. 7A is a front view showing a boosting transformer according to a fifth embodiment of the invention. FIG. 7B is a plan view showing the boosting transformer. FIG. 7C is a side view showing the boosting transformer. FIG. 7D is a perspective view showing the boosting transformer. In FIGS. 7A to 7D, like FIGS. 6A to 6D, the boosting transformer 230 according to the fifth embodiment of the invention has a primary winding 221, a secondary winding 222 and a heater winding 223. That is, the winding sectional area of the primary winding 221 is larger than that of the secondary winding 222. The number of turns in the primary winding 221 is smaller than that in the secondary winding 222. The heater winding 223 is not shown in FIGS. 7A to 7D because the number of turns in the heater winding 223 is extremely smaller than that in the secondary winding 222.

A columnar ferrite core 236 is used in the boosting transformer according to the fifth embodiment of the invention. The primary, secondary and heater windings 221, 222 and 223 are wound around the columnar ferrite core 236 and piled up side by side in a direction of an axis of the core.

An iron oxide powder resin core 237 shaped like a rectangular ring is further used. That is, the iron oxide powder resin core 237 is shaped like a rectangular ring having one inner size (in a left-and-right direction of the iron oxide powder resin core 237 in FIG. 7C) larger than each of outer sizes of the primary winding 221, the secondary winding 222 and the heater winding 223, and the other inner size (in an up-and-down direction of the iron oxide powder resin core 237 in FIG. 7C) larger than the length of the columnar ferrite core 236. As shown in FIG. 7D, the columnar ferrite core 236 is inserted into an inner surface of the iron oxide powder resin core 237 so that the iron oxide powder resin core 237 is disposed opposite to an axial end portion of the columnar ferrite core 236 through a gap G.

In the configuration, the ferrite core 236 low in high-frequency loss is used as a main core and the iron oxide powder resin core 237 smaller in size and more hardly saturated than the ferrite core is disposed on the outside of the primary, secondary and heater windings 221, 222 and 223 and the ferrite core 236 so as to be opposite to the ferrite core 236 through the gap G to prevent saturation. Hence, the boosting transformer 230 greatly contributes to reduction in size compared with the related-art boosting transformer (FIG. 11) having only ferrite cores 74 and 75. In addition, the iron oxide powder resin core 237 is low in high-frequency loss. Accordingly, when the iron oxide powder resin core 237 configured as described above is disposed as described above, high-frequency loss can be only reduced in spite of a high frequency. Hence, a boosting transformer having both the advantage of the ferrite core 236 and the advantage of the iron oxide powder resin core 237 can be obtained.

Moreover, because the ferrite core 236 of the boosting transformer is columnar, the columnar ferrite core 236 can be produced more easily than the rectangular parallelepiped ferrite core. Moreover, because respective opposite portions of the ferrite core 236 and the iron oxide powder resin core 237 are parallel with each other, the gap G which is formed between the ferrite core 236 and the iron oxide powder resin core 237 and through which magnetic flux passes has a constant width. Hence, the coupling coefficient or the like can be designed easily.

In addition, the square-ring shaped iron oxide powder resin core 237 has a function of mechanically protecting the ferrite core 236 and the respective windings 221, 222 and 223 because the square-ring shaped iron oxide powder resin core 237 partially envelops the ferrite core 236 and the respective windings 221, 222 and 223 from the outside.

(Sixth Embodiment)

Figure 8A:
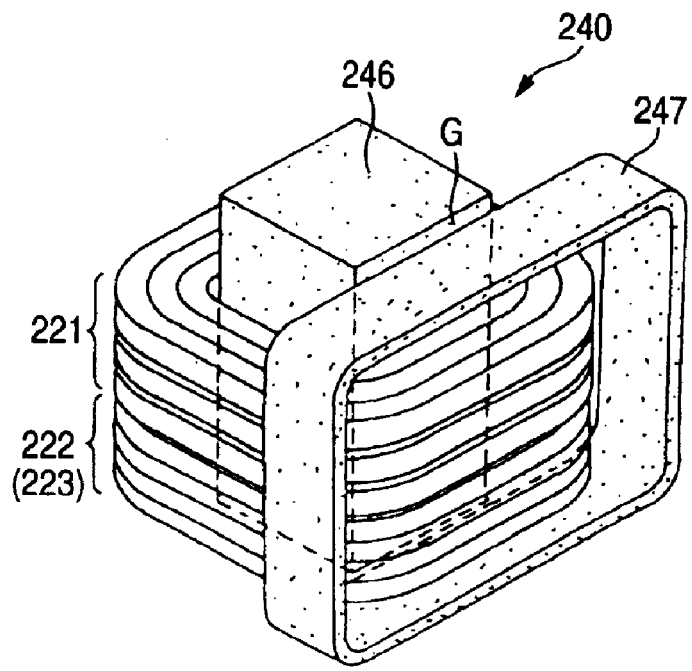
FIG. 8A is a perspective view showing a boosting transformer according to a first example of the sixth embodiment of the invention.
Figure 8B:
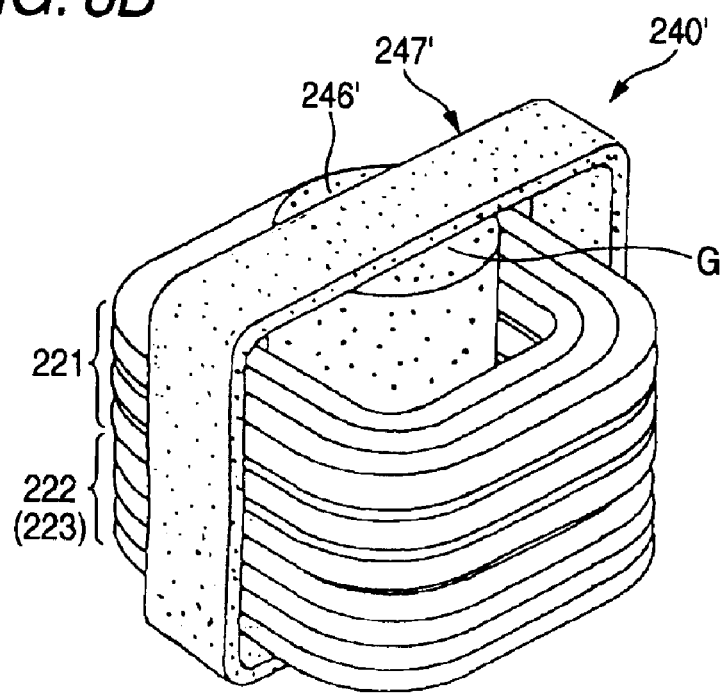
FIG. 8B is a perspective view showing a boosting transformer according to a second example of the sixth embodiment.

FIGS. 8A, and 8B show examples of a boosting transformer according to a sixth embodiment of the invention. FIG. 8A is a perspective view showing a first example of the sixth embodiment. FIG. 8B is a perspective view showing a second example of the sixth embodiment.

In FIG. 8A, the boosting transformer 240 according to the first example of the sixth embodiment has a primary winding 221, a secondary winding 222, and a heater winding 223. The reference numeral 247 designates a square-ring shaped iron oxide powder resin core containing iron oxide powder sealed with a resin. The windings 221, 222 and 223 and the square-ring shaped iron oxide powder resin core 247 are equivalent to corresponding parts in FIGS. 6A to 6D. That is, the winding sectional area of the primary winding 221 is larger than that of the secondary winding 222. The number of turns in the primary winding 221 is smaller than that in the secondary winding 222. The number of turns in the heater winding 223 is extremely smaller than that in the secondary winding 222. The iron oxide powder resin core 247 is shaped like a rectangular ring having one inner size larger than each of outer sizes of the primary, secondary and heater windings 221, 222 and 223 and the other inner size larger than a total size of the three windings (that is, the primary, secondary and heater windings 221, 222 and 223) piled up side by side.

The reference numeral 246 designates a rod-like iron oxide powder resin core used in the first example of the sixth embodiment. The rod-like iron oxide powder resin core 246 is shaped like a rectangular parallelepiped. The primary winding 221, the secondary winding 222 and the heater winding 223 are wound around the rectangular parallelepiped iron oxide powder resin core 246 and piled up side by side in a direction of an axis of the core. The square-ring shaped iron oxide powder resin core 247 is fitted toward the iron oxide powder resin core 246 from the outside of the primary, secondary and heater windings 221, 222 and 223 and disposed opposite to the rod-like iron oxide powder resin core 246 through a gap G secured by a spacer (not shown) disposed between the square-ring shaped iron oxide powder resin core 247 and the rod-like iron oxide powder resin core 246. The gap between the iron oxide powder resin core 246 and the iron oxide powder resin core 247 is selected to be in a range of from about 0.3 mm to about 0.8 mm.

In the configuration, the iron oxide powder resin cores low in high-frequency loss, smaller in cost and size and more hardly saturated than ferrite cores form a main core 246 and an auxiliary core (square-ring shaped core) 247. Hence, the boosting transformer 240 greatly contributes to reduction in size compared with the related-art boosting transformer (FIG. 11) having only ferrite cores.

Moreover, because the iron oxide powder resin core 246 is shaped like a rectangular parallelepiped, respective opposite portions of the iron oxide powder resin core 246 and the iron oxide powder resin core 247 are parallel with each other. Hence, the gap G formed between the iron oxide powder resin core 246 and the iron oxide powder resin core 247 has a constant width, so that the coupling coefficient or the like can be designed easily.

Moreover, because the iron oxide powder resin core 247 is shaped like a rectangular ring, it is easy to produce the iron oxide powder resin core 247. The square-ring shaped iron oxide powder resin core 247 also has a secondary effect in mechanically protecting the respective windings because the square-ring shaped iron oxide powder resin core 247 partially envelops the respective windings from the outside.

In FIG. 8B, the boosting transformer 240' according to the second example of the sixth embodiment has a primary winding 221, a secondary winding 222, and a heater winding 223. The reference numeral 247' designates a square-ring shaped iron oxide powder resin core containing iron oxide powder sealed with a resin. The windings 221, 222 and 223 and the square-ring shaped iron oxide powder resin core 247' are equivalent to corresponding parts in FIGS. 7A to 7D. The reference numeral 246' designates a columnar iron oxide powder resin core used in the second example of the sixth embodiment. The primary winding 221, the secondary winding 222 and the heater winding 223 are wound around the columnar iron oxide powder resin core 246' and piled up side by side in a direction of an axis of the core. The primary, secondary and heater windings 221, 222 and 223 and the iron oxide powder resin core 246' are covered with the square-ring shaped iron oxide powder resin core 247' so as to be enveloped in the square-ring shaped iron oxide powder resin core 247'. A gap G is secured between the iron oxide powder resin core 246' and the square-ring shaped iron oxide powder resin core 247'. The gap between the iron oxide powder resin cores 246' and 247' is selected to be in a range of from about 0.3 mm to about 0.8 mm.

In the configuration, the iron oxide powder resin cores low in high-frequency loss, smaller in cost and size and more hardly saturated than ferrite cores form a main core 246' and an auxiliary core (square-ring shaped core) 247'. Hence, the boosting transformer 240' greatly contributes to reduction in size compared with the related-art boosting transformer (FIG. 11) having only ferrite cores.

Moreover, because respective opposite portions of the iron oxide powder resin cores 246' and 247' are parallel with each other, the gap G formed between the iron oxide powder resin cores 246' and 247' has a constant width. Hence, the coupling coefficient or the like can be designed easily.

Moreover, because the iron oxide powder resin core 247' is shaped like a rectangular ring, it is easy to produce the iron oxide powder resin core 247'. The resin core 247' also has an effect in mechanically protecting the respective windings because the resin core 247' partially envelops the respective windings and the iron oxide powder resin core 246' from the outside.

(Seventh Embodiment)

Figure 9A:
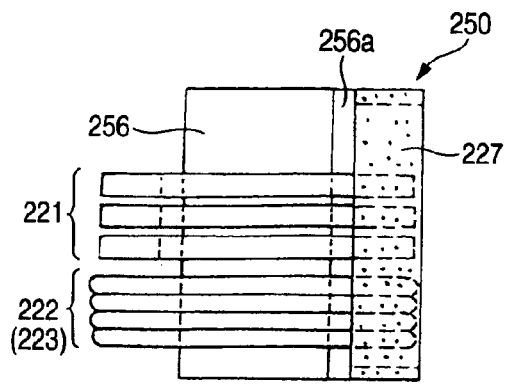
FIG. 9A is a front view showing a boosting transformer according to a seventh embodiment of the invention.
Figure 9B:
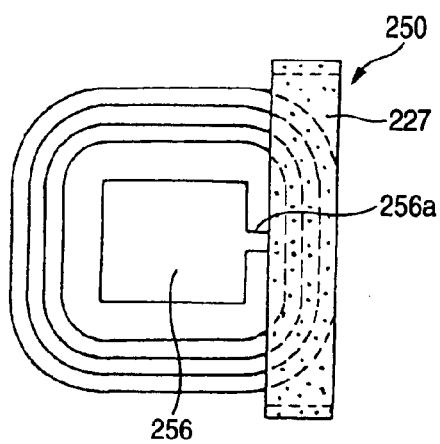
FIG. 9B is a plan view showing the boosting transformer.
Figure 9C:
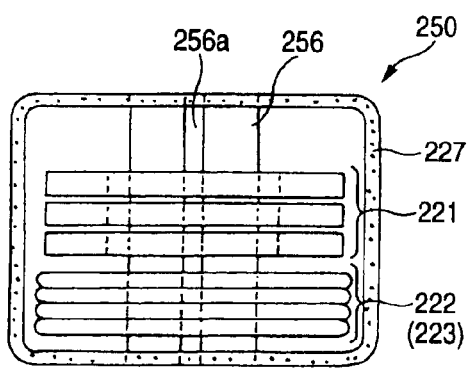
FIG. 9C is a side view showing the boosting transformer.
Figure 9D:
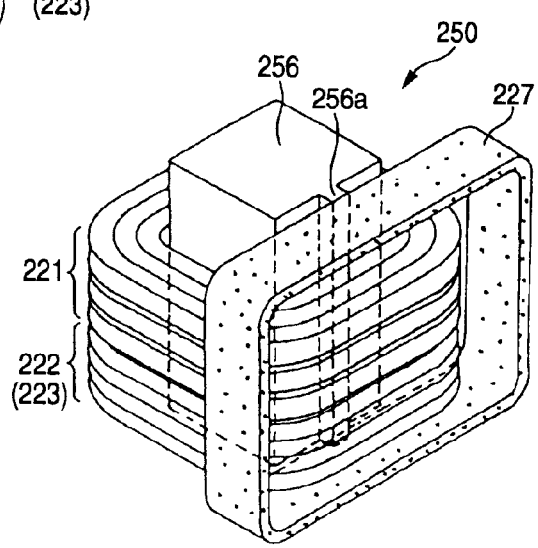
FIG. 9D is a perspective view showing the boosting transformer.

FIG. 9A is a front view showing a boosting transformer according to a seventh embodiment of the invention. FIG. 9B is a plan view showing the boosting transformer. FIG. 9C is a side view showing the boosting transformer. FIG. 9D is a perspective view showing the boosting transformer. In FIGS. 9A to 9D, like FIGS. 6A to 6D, the boosting transformer 250 according to the seventh embodiment of the invention has a primary winding 221, a secondary winding 222 and a heater winding 223. The reference numeral 256 designates a ferrite core shaped like a rectangular parallelepiped. The primary winding 221, the secondary winding 222 and the heater winding 223 are wound around the rectangular parallelepiped ferrite core 256 and piled up side by side in a direction of an axis of the core. The reference numeral 227 designates an iron oxide powder resin core the same as in FIGS. 6A to 6D. That is, the iron oxide powder resin core 227 is shaped like a rectangular ring having one inner size (in a left-and-right direction of the iron oxide powder resin core 227 in FIG. 9C) larger than each of outer sizes of the primary, secondary and heater windings 221, 222 and 223, and the other inner size (in an up-and-down direction of the iron oxide powder resin core 227 in FIG. 9C) larger than a total size of the three windings (that is, the primary winding 221, the secondary winding 222 and the heater winding 223) piled up side by side.

According to the seventh embodiment of the invention, a protrusion 256a is formed on a part of a surface of the rectangular parallelepiped ferrite core 256 opposite to the iron oxide powder resin core 227. The height of the protrusion 256a is substantially equal to the width of the gap G shown in FIGS. 6A to 6D. Because the gap G to be secured between the rectangular parallelepiped ferrite core 256 and the iron oxide powder resin core 227 can be secured by the protrusion 256a, it is unnecessary to use the spacer used in FIGS. 6A to 6D. Hence, it is unnecessary to provide the spacer separately and labor and time for incorporating the spacer in the boosting transformer can be omitted. Hence, the boosting transformer can be assembled easily as well as is the cost of the boosting transformer can be reduced.

The protrusion 256a is formed so that the cross-sectional area in a passing direction of a magnetic path is selected to be small. That is, magnetic flux density is saturated with slight magnetic flux and a magnetic short circuit is prevented from being formed.

Although FIGS. 9A to 9D show the case where one protrusion 256a is formed in the central portion of a side of the rectangular parallelepiped ferrite core 256, the invention may be also applied to the case where a pair of protrusions are formed at opposite end portions respectively on a side of the rectangular parallelepiped ferrite core 256 so that the pair of protrusions are brought into contact with the iron oxide powder resin core 227 at two points. In this case, stability of assembling can be made better.

Although this embodiment has shown the case where the protrusion 256a is applied to the rectangular parallelepiped ferrite core 226 shown in FIGS. 6A to 6D, the invention may be also perfectly adapted to the case where the protrusion 256a is applied to the rod-like iron oxide powder resin core 246 shown in FIG. 8A.

(Eighth Embodiment)

Figure 10A:
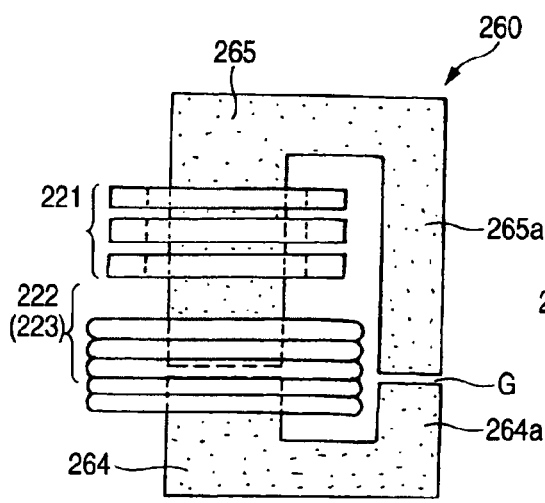
FIG. 10A is a front view showing a boosting transformer according to a eighth embodiment of the invention.
Figure 10B:
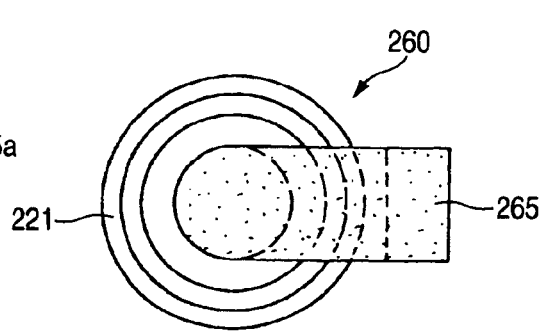
FIG. 10B is a plan view showing the boosting transformer.
Figure 10C:
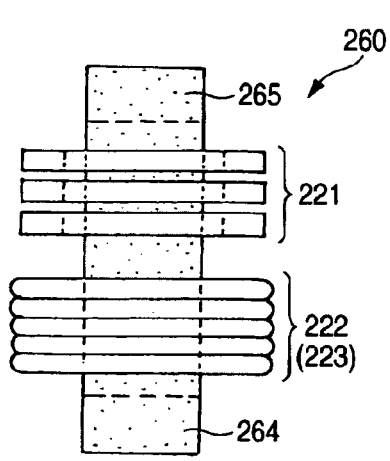
FIG. 10C is a side view showing the boosting transformer.
Figure 10D:
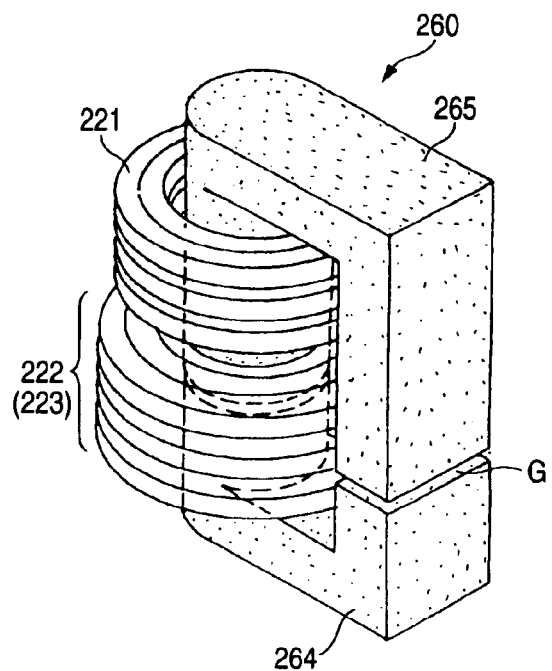
FIG. 10D is a perspective view showing the boosting transformer.

FIG. 10A is a front view showing a boosting transformer according to an eighth embodiment of the invention. FIG. 10B is a plan view showing the boosting transformer. FIG. 10C is a side view showing the boosting transformer. FIG. 10D is a perspective view showing the boosting transformer. In FIGS. 10A to 10D, the boosting transformer 260 according to the eighth embodiment of the invention has a primary winding 221, a secondary winding 222, a heater winding 223, and U-shaped iron oxide powder resin cores 264 and 265 each containing iron oxide powder sealed with a resin. The windings 221, 222 and 223 are the same as corresponding parts in FIGS. 6A to 6D. That is, the winding sectional area of the primary winding 221 is larger than that of the secondary winding 222. The number of turns in the primary winding 221 is smaller than that in the secondary winding 222. The number of turns in the heater winding 223 is extremely smaller than that in the secondary winding 222. As shown in FIGS. 10A to 10D, the U-shaped iron oxide powder resin cores 264 and 265 are disposed opposite to each other through a gap G formed between forward ends of U figures of the U-shaped iron oxide powder resin cores 264 and 265. Respective one-leg portions of the U-shaped iron oxide powder resin cores 264 and 265 are butt-jointed to each other to form a core around which the primary, secondary and heater windings 221, 222 and 223 are piled up side by side in a direction of an axis of the core. The gap G between the iron oxide powder resin cores 264 and 265 is selected to be in a range of from about 0.3 mm to about 0.8 mm.

In the configuration, the iron oxide powder resin cores 264 and 265 low in high-frequency loss, smaller in cost and size and more hardly saturated than ferrite cores form all core portions in the boosting transformer. Hence, the boosting transformer 260 greatly contributes to reduction in size compared with the related-art boosting transformer (FIG. 11) having only ferrite cores.

The present invention is based on Japanese Patent Applications No. 2002-067067 and No. 2002-067068, which are incorporated herein by references. While only certain embodiments of the invention have been specifically described herein, it will be apparent that numerous modifications may be made thereto without departing from the spirit and scope of the invention.

<Advantage of the Invention>

As described above, in the boosting transformer according to the invention, the ferrite core low in high-frequency loss is used as a main core while the metal core small-sized and higher in saturation magnetic flux density than the ferrite core is used so as to be opposite to the ferrite core through a gap to prevent saturation. Moreover, the metal core is formed in such a manner that metal thin plates are laminated to one another in a flow direction of eddy current to prevent eddy current from flowing. In addition, the metal core is shaped like a square-ring. Hence, the metal core is easy to produce, small in size and hard and has an effect in mechanically protecting the outside of the respective windings.

Moreover, because the protrusion is formed on a part of a surface of the rectangular parallelepiped ferrite core opposite to the metal core, it is unnecessary to prepare any spacer separately and labor and time for incorporating any spacer in the boosting transformer can be omitted. Hence, the boosting transformer can be assembled easily.

Moreover, because the gap formed between the rod-like ferrite core and the metal core can be selected suitably, the coupling coefficient of the boosting transformer can be adjusted easily to any optimum value.

Additionally, in the boosting transformer according to the invention, there is used a core of iron oxide powder sealed with a resin, which is low in high-frequency loss and which can be made smaller in cost and size and which is higher in saturation magnetic flux density than a ferrite core. Moreover, a gap is provided to prevent saturation. Hence, there can be obtained a boosting transformer easy to produce, small in size and cost and hard.

What is claimed is:

1. A magnetron drive boosting transformer for supplying a drive voltage to a magnetron, comprising:
   a rod-like ferrite core;
   primary and secondary windings wound around said rod-like ferrite core;
   a square-ring shaped core arranged to the side of said rod-like ferrite core and separated from said rod-like ferrite core by a gap and is fitted toward said rod-like ferrite core from the outside of said primary and secondary windings.

2. The magnetron drive boosting transformer according to claim 1,
wherein said square-ring shaped core has first inner diameter larger than each of outer sizes of said primary and secondary windings, and a second inner diameter larger than a total size of said primary and secondary windings piled up side by side.

3. The magnetron drive boosting transformer according to claim 2,
wherein said primary and secondary windings are piled up side by side in a direction of an axis of said rod-like ferrite core, and
wherein said square-ring shaped core is made of metal and formed from a long metal thin plate rolled by a plurality of times into a square-ring.

4. The magnetron drive boosting transformer according to claim 1,
wherein said rod-like ferrite core is shaped like a rectangular parallelepiped.

5. The magnetron drive boosting transformer according to claim 3,
wherein said rod-like ferrite core is shaped like a rectangular parallelepiped.

6. The magnetron drive boosting transformer according to claim 5,
wherein said ferrite core has a protrusion on a part of its surface opposite to said metal core, and
wherein said protrusion being in contact with said metal core.

7. A magnetron drive boosting transformer for supplying a drive voltage to a magnetron, comprising:
a rod-like ferrite core;
primary and secondary windings wound around said rod-like ferrite core and piled up side by side in a direction of an axis of said rod-like ferrite core; and
a square-ring shaped core having a first inner diameter larger than each of outer sizes of said primary and secondary windings, and a second inner diameter larger than a length of said rod-like ferrite core;
wherein said rod-like ferrite core together with said primary and secondary windings is inserted into said square-ring shaped core, and
wherein said square-ring shaped core is arranged opposite to an axial end of said rod-like ferrite core and wherein a gap separates said rod-like ferrite core and said square-ring shaped core.

8. The magnetron drive boosting transformer according to claim 7,
wherein said square-ring shaped core is made of metal and formed from a laminate of a plurality of square-ring shaped metal thin plates in a direction of thickness thereof.

9. The magnetron drive boosting transformer according to claim 7,
wherein said rod-like ferrite core is columnar.

10. A magnetron drive boosting transformer for supplying a drive voltage to a magnetron, comprising:
a rod-like ferrite core;
primary and secondary windings wound around said rod-like ferrite core; and
a square-ring shaped iron oxide powder resin core containing iron oxide powder sealed with a resin;
wherein said square-ring shaped iron oxide powder resin core is fitted toward said rod-like ferrite core from the outside of said primary and secondary windings, and is disposed to the side of said rod-like ferrite core and is separated by a gap formed between said square-ring shaped iron oxide powder resin core and said rod-like ferrite core.

11. The magnetron drive boosting transformer according to claim 10,
wherein said primary and secondary windings are piled up side by side in a direction of an axis of said rod-like ferrite core, and
wherein said square-ring shaped iron oxide powder resin core has a first inner size larger than each of outer sizes of said primary and secondary windings, and a second inner size larger than a total size of said primary and secondary windings piled up side by side.

12. The magnetron drive boosting transformer according to claim 10,
wherein said rod-like ferrite core is shaped like a rectangular parallelepiped.

13. A magnetron drive boosting transformer for supplying a drive voltage to a magnetron, comprising:
a rod-like ferrite core;
primary and secondary windings wound around said rod-like ferrite core and piled up side by side in a direction of an axis of said rod-like ferrite core; and
a square-ring shaped iron oxide powder resin core containing iron oxide powder sealed with a resin;
wherein said iron oxide powder resin core has a first inner size larger than each of outer sizes of said primary and secondary windings and a second inner size larger than a length of said rod-like ferrite core and is disposed opposite to said axial end of said rod-like ferrite core through a gap formed between said rod-like ferrite core and said rectangular ring-shaped iron oxide powder resin core.

14. The magnetron drive boosting transformer according to claim 13,
wherein said rod-like ferrite core is columnar.

15. The magnetron drive boosting transformer according to claim 12,
wherein a protrusion is formed on a part of a surface of said rectangular parallelepiped core opposite to said square-ring shaped iron oxide powder resin core so that said protrusion is brought into contact with said square-ring shaped iron oxide powder resin core.

16. The magnetron drive boosting transformer according to claim 15,
wherein said rod-like ferrite core is replaced by a rod-like iron oxide powder resin core containing iron oxide powder sealed with a resin.

17. The magnetron drive boosting transformer according to claim 2,
wherein said rod-like ferrite core is shaped like a rectangular parallelepiped.

18. The magnetron drive boosting transformer according to claim 8,
wherein said rod-like ferrite core is columnar.

19. The magnetron drive boosting transformer according to claim 11,
wherein said rod-like ferrite core is shaped like a rectangular parallelepiped.

20. The magnetron drive boosting transformer according to any one of claims 1 through 9, 17, and 18, wherein magnetic reluctance is changed by said gap between said rod-like ferrite core and said square-ring shaped core.

21. The magnetron drive boosting transformer according to any one of claims 10 through 14 and 18, wherein said rod-like ferrite core is replaced by a rod-like iron oxide powder resin core containing iron oxide powder sealed with a resin.

* * * * *